United States Patent
Mori

(10) Patent No.: US 9,356,580 B2
(45) Date of Patent: May 31, 2016

(54) INSULATED GATE SEMICONDUCTOR ELEMENT DRIVE DEVICE

(71) Applicant: FUJI ELECTRIC CO., LTD., Kawasaki-shi (JP)

(72) Inventor: Takahiro Mori, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/637,804

(22) Filed: Mar. 4, 2015

(65) Prior Publication Data

US 2015/0180453 A1    Jun. 25, 2015

Related U.S. Application Data

(63) Continuation of application No. PCT/JP2013/076724, filed on Oct. 1, 2013.

(30) Foreign Application Priority Data

Nov. 1, 2012   (JP) .................................. 2012-242242

(51) Int. Cl.
| | |
|---|---|
| H03K 17/60 | (2006.01) |
| H02M 1/088 | (2006.01) |
| H03K 3/012 | (2006.01) |
| H03K 17/12 | (2006.01) |

(52) U.S. Cl.
CPC ............... *H03K 3/012* (2013.01); *H02M 1/088* (2013.01); *H03K 17/127* (2013.01); *H03K 17/60* (2013.01)

(58) Field of Classification Search
CPC ..... H03K 3/012; H03K 17/60; H03K 17/127; H02M 1/088
See application file for complete search history.

(56) References Cited

U.S. PATENT DOCUMENTS

| | | | | |
|---|---|---|---|---|
| 7,592,853 | B2 * | 9/2009 | Nakamori | H03K 17/168 327/108 |
| 8,970,259 | B2 * | 3/2015 | Mori | H03K 17/145 327/108 |
| 2008/0094111 | A1 | 4/2008 | Nakamori et al. | |
| 2010/0213989 | A1 | 8/2010 | Nakatake et al. | |
| 2013/0147525 | A1 * | 6/2013 | Takagiwa | H03K 3/012 327/109 |

FOREIGN PATENT DOCUMENTS

| | | |
|---|---|---|
| JP | 11235015 A | 8/1999 |
| JP | 2002095240 A | 3/2002 |

(Continued)

OTHER PUBLICATIONS

International Search Report issued in PCT/JP2013/076724, mailed Nov. 5, 2013. English translation provided.

*Primary Examiner* — Patrick O'Neill
(74) *Attorney, Agent, or Firm* — Rossi, Kimms & McDowell LLP

(57) ABSTRACT

A drive circuit includes a constant current circuit which supplies a constant current to the gate of an IGBT and on-operates the IGBT; a discharge circuit which grounds the gate of the IGBT and off-operates the IGBT; and a switch circuit which operates one of the constant current circuit or discharge circuit in accordance with a control signal and turns on or off the IGBT. In particular, the drive circuit includes a current detection circuit which detects a current flowing through the IGBT when the IGBT is turned on; and a current regulation circuit which feeds the current detected by the current detection circuit back to the constant current circuit and controls an output current of the constant current circuit in accordance with the turn-on characteristics of the IGBT.

5 Claims, 4 Drawing Sheets

(56) References Cited

FOREIGN PATENT DOCUMENTS

| | | |
|---|---|---|
| JP | 2004229382 A | 8/2004 |
| JP | 2005253183 A | 9/2005 |
| JP | 2008103895 A | 5/2008 |
| JP | 2008178248 A | 7/2008 |
| JP | 2009095166 A | 4/2009 |
| JP | 2011024368 A | 2/2011 |
| WO | 2009044602 A1 | 4/2009 |

* cited by examiner

INSULATED GATE SEMICONDUCTOR ELEMENT DRIVE DEVICE

CROSS-REFERENCE TO RELATED APPLICATIONS

This application is a continuation of International Application No. PCT/JP 2013/076724, filed on Oct. 1, 2013, which is based on and claims priority to Japanese Patent Application No. JP 2012-242242, filed on Nov. 1, 2012. The disclosure of the Japanese priority application and the PCT application in their entirety, including the drawings, claims, and the specification thereof, are incorporated herein by reference.

BACKGROUND OF THE INVENTION

1. Technical Field

The present invention relates to an insulated gate semiconductor drive device which can parallel drive a plurality of insulated gate semiconductor elements connected in parallel, uniformly, with a constant current.

2. Related Art

In a power converter corresponding to a large power load, a plurality of insulated gate semiconductor elements formed of IGBTs, MOS-FETs, or the like, for power control are connected in parallel, and a parallel drive of the insulated gate semiconductor elements is carried out. Also, it is proposed in, for example, Japanese Patent Application Publication No. JP-A-2008-103895 that in place of voltage controlling the gates of the insulated gate semiconductor elements, a constant current is supplied to the gates to turn on the insulated gate semiconductor elements, thereby reducing an occurrence of loss and noise when the insulated gate semiconductor elements are turned on.

This kind of power converter 1 is configured including a plurality of drive circuits 3a to 3n which individually drive a plurality of insulated gate semiconductor elements, for example, IGBTs 2a to 2n, respectively, as shown in, for example, FIG. 5. The plurality IGBTs 2a to 2n are provided in parallel with the collectors connected to each other and the emitters connected to each other. A large power load 4 is connected to the collectors connected in parallel of the IGBTs 2a to 2n.

As an outline configuration of the drive circuit 3a is shown in FIG. 5, each of the plurality of drive circuits 3a to 3n includes a constant current circuit 7 formed of a constant current source 5, which outputs a constant current Io in accordance with a reference voltage Vref, and a current mirror circuit 6 which supplies a current [k·Io] proportional to an output current Io of the constant current source 5 to the gate of the IGBT 2a. Furthermore, the drive circuit 3a is configured including a discharge circuit 8, which grounds the gate of the IGBT 2a and off-operates the IGBT 2a, and a switch circuit 9 which complementarily on/off controls the current mirror circuit 6 and discharge circuit in accordance with a control signal.

The constant current source 5 is configured of an n-channel FET (hereafter abbreviated to an n-FET) 5a and an OP amplifier 5c which controls the gate voltage of the n-FET 5a in accordance with the difference between a reference voltage Vref and a voltage generated in a resistor 5b interposed between the source of the n-FET 5a and a ground line. When the value of the resistor 5b is taken to be Rref, the output current Io of the n-FET 5a configuring the constant current source 5, by being controlled by the OP amplifier 5c, is made constant as:

$Io = Vref/Rref$

Also, the current mirror circuit 6 is configured of a p-channel FET (hereafter abbreviated to a p-FET) 6a, connected to the constant current source 5, which is driven by the output current Io of the constant current source 5, and a p-FET 6b provided paired with the p-FET 6a. The p-FET 6b assumes the role of supplying a constant current [k·Io] proportional to the constant current Io to the gate of the IGBT 2a.

Also, the discharge circuit 8 is configured of a buffer 8a, which inputs a control signal, and an n-FET 8b which on/off operates by being gate controlled by the buffer 8a and discharges electric charge accumulated in the gate of the IGBT 2a. Furthermore, the switch circuit 9 is configured of a p-FET 9a connected in parallel to the p-FET 6b of the current mirror circuit 6 and a level shift circuit 9b which turns on/off the p-FETs 6a and 6b of the current mirror circuit 6 by level shifting the control signal and controlling the gate voltage of the p-FET 9a.

When the control signal is at an L level, the switch circuit 9 turns off the discharge circuit 8 and turns on the p-FET 9a. By so doing, the constant current [k·Io] is supplied to the gate of the IGBT 2a via the p-FET 6b of the current mirror circuit 6, and the IGBT 2a is turned on. Also, when the control signal is at an H level, the switch circuit 9, by turning off the p-FET 9a, stops the current supply to the gate of the IGBT 2a via the current mirror circuit 6, and turns on the n-FET 8b of the discharge circuit 8. By so doing, the electric charge accumulated in the gate of the IGBT 2a is discharged, and the IGBT 2a is turned off.

According to the drive circuit 3a configured in this way, as the constant current is supplied to the gate of the IGBT 2a to turn on the IGBT 2a, the speed of charging the electric charge accumulated in the gate of the IGBT 2a can be made constant. Consequently, according to the drive circuit 3a, it does not happen that the charging speed of the gate of an IGBT varies due to a change in on resistance depending on the temperature of the IGBT, as in a heretofore known common drive method whereby the gate voltage of the IGBT is controlled to turn on/off the IGBT. Therefore, with the drive circuit 3a, the turn-on time of the IGBT 2a can be made constant regardless of a temperature change, and it is thus possible to reduce loss and noise when the IGBT 2a is turned on.

However, as previously described, when the drive circuits 3a to 3n parallel drive the plurality of IGBTs 2a to 2n connected in parallel, there is fear that a current flows concentratedly through an IGBT having a low gate threshold voltage even though each IGBT 2a to 2n is hypothetically turned on by being supplied with the constant current, as heretofore described. Incidentally, variations in the gate threshold voltages of the IGBTs 2a to 2n are due to the solidity of the IGBTs. This kind of current concentration on a specific IGBT when the plurality of IGBTs 2a to 2n are turned on brings about the risk of causing a thermal breakdown of the IGBT.

As heretofore known, therefore, it is proposed, as disclosed in, for example, Japanese Patent Application Publication No. JP-A-11-235015 (also referred to herein as "PTL 2"), that gate current values of the plurality of IGBTs 2a to 2n are measured and stored in advance, and the gate currents of the IGBTs 2a to 2n are controlled based on the gate current values, thus achieving a current balance. Also, it is proposed in, for example, Japanese Patent Application Publication No. JP-A-2008-178248 (also referred to herein as "PTL 3"), that an equipotential offset is given to the drive control voltages and emitter voltages of the IGBTs 2a to 2n in accordance with the difference between a target gate threshold voltage and the gate threshold voltages of the IGBTs 2a to 2n, and further, that the turn-on timings of the IGBTs 2a to 2n are aligned by the equipotential offset, thereby achieving a current balance.

In the technique shown in each PTL 2 and PTL 3, however, it is necessary to obtain the respective gate current values or gate threshold voltages of the plurality of IGBTs 2a to 2n in advance. Moreover, it is necessary to individually control the gate currents of the IGBTs 2a to 2n in accordance with IGBT characteristic data obtained in advance. Alternatively, it is necessary to offset control the respective drive control voltages and emitter voltages of the IGBTs 2a to 2n. Therefore, in the heretofore known technique, there is the problem that regulation requires time and effort, and in addition, the configuration is complicated.

SUMMARY OF INVENTION

The invention, having been contrived bearing in mind these kinds of circumstances, has for its object to provide an insulated gate semiconductor element drive device, of a simple configuration, which can parallel drive a plurality of insulated gate semiconductor elements connected in parallel, uniformly and in a good current balance, with a constant current.

The invention relates to an insulated gate semiconductor element drive device, including a plurality of drive circuits which drive a plurality of respective insulated gate semiconductor elements connected in parallel, which drives each of the drive circuits in accordance with a control signal and parallel drives the plurality of insulated gate semiconductor elements. In particular, the insulated gate semiconductor element drive device according to the invention, in order to achieve the heretofore described object, is characterized in that each of the drive circuits includes: a constant current circuit which supplies a constant current to the gate of the insulated gate semiconductor element formed of, for example, an IGBT or a MOS-FET, and on-operates the insulated gate semiconductor element; a discharge circuit which grounds the gate of the insulated gate semiconductor element and off-operates the insulated gate semiconductor element; a switch circuit which operates one of the constant current circuit or discharge circuit in accordance with a control signal and turns on or off the insulated gate semiconductor element; a current detection circuit which detects a current flowing through the insulated gate semiconductor element when the insulated gate semiconductor element is turned on; and a current regulation circuit which feeds the current detected by the current detection circuit back to the constant current circuit and controls an output current of the constant current circuit.

Incidentally, the current regulation circuit is formed of, for example, an error amplifier which obtains a voltage difference between a preset reference voltage and an output voltage of the current detection circuit and controls the output current of the constant current circuit in accordance with the voltage difference. Alternatively, the current regulation circuit is formed of, for example, a comparator which compares a preset reference voltage and an output voltage of the current detection circuit and causes the output current of the constant current circuit to vary in multiple stages in accordance with a result of the comparison.

Also, the constant current circuit is preferably configured of a current mirror circuit, interposed between the gate of the insulated gate semiconductor element and a power supply voltage, and a constant current source which supplies a current to the insulated gate semiconductor element via the current mirror circuit.

According to the insulated gate semiconductor element drive device of this kind of configuration, the size of a constant current, which is supplied to each of a plurality of insulated gate semiconductor elements, for turning on each of the insulated gate semiconductor elements is regulated in accordance with currents flowing through the plurality of insulated gate semiconductor elements, connected in parallel, which are individually driven by a plurality of respective drive circuits. Therefore, the turn-on times of the plurality of insulated gate semiconductor elements can be aligned regardless of variations in the gate threshold voltages of the plurality of insulated gate semiconductor elements due to the solidity of the insulated semiconductor elements. Moreover, as the constant current is supplied to each of the insulated gate semiconductor elements, each insulated gate semiconductor element can be turned on regardless of a change in on resistance of the insulated gate semiconductor elements depending on temperature. Consequently, it is possible to reduce loss and noise when the insulated gate semiconductor elements are turned on.

Therefore, according to the invention, with a simple configuration such that the size of the constant current supplied to the gates of the insulated gate semiconductor elements is regulated in accordance with the currents flowing through the insulated gate semiconductor elements, it is possible to secure the current balance of the plurality of insulated gate semiconductor elements. Therefore, according to the invention, there are virtually numerous benefits such that it is possible to prevent a thermal breakdown of an insulated gate semiconductor element due to a current concentration thereon from occurring, and the like.

DETAILED DESCRIPTION

Figure 1:
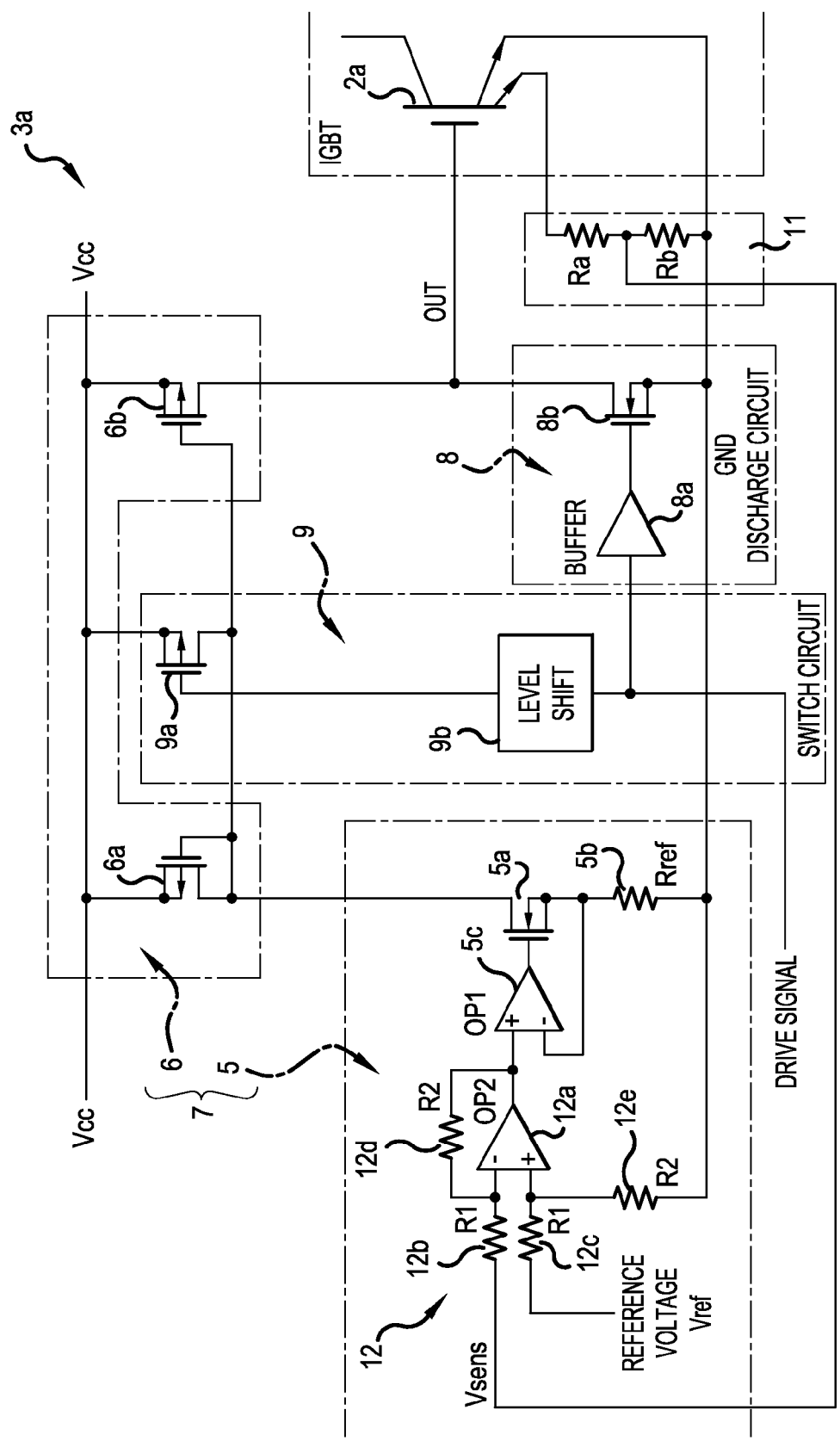
FIG. 1 is a main portion outline configuration diagram of an insulated gate semiconductor element drive device according to a first embodiment of the invention.

Hereafter, a description will be given, referring to the drawings, of an insulated gate semiconductor element drive device according to embodiments of the invention.

FIG. 1 is a main portion outline configuration diagram of an insulated gate semiconductor element drive device according to a first embodiment. FIG. 1 shows an outline configuration of a drive circuit 3a as a representative one of drive circuits 3a to 3n which drive a plurality of respective IGBTs 2a to 2n, but the other drive circuits 3b to 3n are configured in the same way. Also, the drive circuit 3a is shown with the same signs given to the same portions as those of a heretofore known drive circuit 3a shown in FIG. 5.

Herein, a little more detailed description will be given of the constant current circuit 7 formed of the constant current source 5 and current mirror circuit 6, the discharge circuit 8, and the switch circuit 9. The constant current source 5 is configured of an n-FET 5a, the source of which is grounded via a resistor 5b, and an OP amplifier 5c, the inverting input terminal (−) of which is connected to the source of the n-FET 5a and into the non-inverting terminal (+) of which a reference voltage Vref is input, which controls the gate of the n-FET 5a. That is, the OP amplifier 5c is used as an error amplifier. Further, when the resistor 5b is given as Rref, the n-FET 5a outputs a constant current Io which is:

$$Io = Vref/Rref$$

The current mirror circuit 6 is formed of a p-FET 6a, the source of which is connected to a power supply voltage Vcc and the drain and gate of which are connected to the drain of the n-FET 5a of the constant current source 5, and a p-FET 6b, the source of which is connected to the power supply voltage Vcc and the gate of which is connected to the gate of the p-FET 6a. The p-FET 6a of the current mirror circuit 6 is driven by a current flowing through the n-FET 5a of the constant current source 5, that is, the output current Io of the constant current source 5. Also, the p-FET 6b for current output, which is provided in mirror image fashion to the p-FET 6a, outputs a constant current [k·Io] proportional to the output current Io. The constant current [k·Io] output from this kind of current mirror circuit 6 (p-FET 6b) is supplied to the gate of the IGBT 2a connected to the drain of the p-FET 6b.

Also, the drain of an n-FET 8b, the source of which is grounded, is connected to the gate of the IGBT 2a. The n-FET 8b on/off operates by being gate controlled by a buffer 8a which operates upon receiving a control signal, and configures the discharge circuit 8 which discharges electric charge accumulated in the gate of the IGBT 2a. Further, the switch circuit 9 is configured of a p-FET 9a, the source of which is connected to the power supply voltage Vcc and the drain of which is connected to the drain of the p-FET 6b of the current mirror circuit 6, and a level shift circuit 9b which turns on/off the p-FET 9a by level shifting the control signal and gate controlling the p-FET 9a.

When the control signal is at an L level, the switch circuit 9, by turning on the p-FET 9a via the level shift circuit 9b, turns on each of the P-FETs 6a and 6b of the current mirror circuit 6. By so doing, the constant current is supplied to the gate of the IGBT 2a via the p-FET 6b. At this time, the buffer 8a, by applying the control signal of the L level to the n-FET 8b, turns off the n-FET 8b. As a result of this, the IGBT 2a is turned on by the gate thereof being supplied with the constant current.

Also, when the control signal is at an H level, the switch circuit 9, by turning off the p-FET 9a via the level shift circuit 9b, turns off each of the p-FETs 6a and 6b of the current mirror circuit 6. By so doing, the function of the current mirror circuit 6 is stopped, and the current output via the p-FET 6b is stopped. At this time, the control signal of the H level is applied to the gate of the n-FET 8b via the buffer 8a, and the n-FET 8b is turned on. By the n-FET 8b being turned on, the electric charge accumulated in the gate of the IGBT 2a is discharged, and the IGBT 2a is turned off.

Herein, the drive circuit 3a according to the embodiment is characterized in that it includes a current detection circuit 11 and a current regulation circuit 12 in addition to the constant current circuit 7 formed of the constant current source 5 and current mirror circuit 6, the discharge circuit 8, and the switch circuit 9. The current detection circuit 11 detects a current flowing through the IGBT 2a and outputs a sense voltage proportional to the current. Also, the current regulation circuit 12, in accordance with the sense voltage, feedback controls the output current Io of the constant current source 5, thus causing the output current Io to vary.

Specifically, the current detection circuit 11 is configured so as to voltage divide via resistors Ra and Rb connected in series, and detect, a current output via, for example, a current detection sense emitter included in the IGBT 2a, that is, a current proportional to the current flowing through the IGBT 2a. The current regulation circuit 12, via an OP amplifier 12a configuring a difference voltage detector, detects a voltage difference ΔV between a sense voltage Vsens, which is detected by the current detection circuit 11 and output as a voltage value, and a preset reference voltage Vref for defining the output current Io of the constant current source 5. Further, the current regulation circuit 12 is configured so as to apply the output voltage of the OP amplifier 12a to the OP amplifier 5c.

Specifically, the current regulation circuit 12 includes the OP amplifier 12a, into the inverting terminal of which the sense voltage Vsens is input via an input resistor 12b and into the non-inverting input of which the reference voltage Vref is input via an input resistor 12c. Furthermore, the current regulation circuit 12 includes a feedback resistor 12d, provided between the output terminal and inverting terminal of the OP amplifier 12a, and a grounding resistor 12e interposed between the non-inverting terminal and a ground line. When the values of the input resistors 12b and 12c are each taken to be R1, and the respective values of the feedback resistor 12d and grounding resistor 12e are taken to be R2, the current regulation circuit 12 applies an output voltage Vout of the OP amplifier 12a which is $$Vout = (R2/R1) \cdot (Vref - Vsens)$$

to the non-inverting input terminal of the OP amplifier 5c of the constant current source 5.

As a result of this, when the value of the resistor 5b is taken to be Rref, the output current Io of the constant current source 5 is:

$$Io = \{R2/(R1 \cdot Rref)\} \cdot (Vref - Vsens)$$

In other words, the current regulation circuit 12 feedback controls the output current Io of the constant current source 5 in accordance with the voltage difference ΔV between the sense voltage Vsens equivalent to the current flowing through the IGBT 2a and the reference voltage Vref. In particular, by using resistors having the same temperature characteristics as the resistors Ra and Rb of the current detection circuit 11, the current flowing through the IGBT 2a can be detected as the sense voltage Vsens without being affected by a temperature change. Consequently, it is possible to control the output current Io of the constant current source 5 in accordance with variations in the gate threshold voltage of the IGBT 2a due to the solidity of the IGBT 2a and thereby control the size of the constant current supplied to the gate of the IGBT 2a.

In particular, by using resistors having the same temperature characteristics as the input resistors 12b and 12c, feedback resistor 12d, and grounding resistor 12e, variations in the resistance values thereof can be cancelled out. A configuration is preferably such as to keep the temperature characteristics of the reference voltage Vref within ±3% of a reference value, and keep the temperature characteristics of the sense voltage Vsens within ±10% of the reference value, in the range of, for example, −20° C. to 125° C. By so doing, it is possible, in combination with the effect of canceling out the variations in the resistance values, to sufficiently increase the precision of the output current characteristics of the constant current source 5 against a temperature change.

Figure 2:
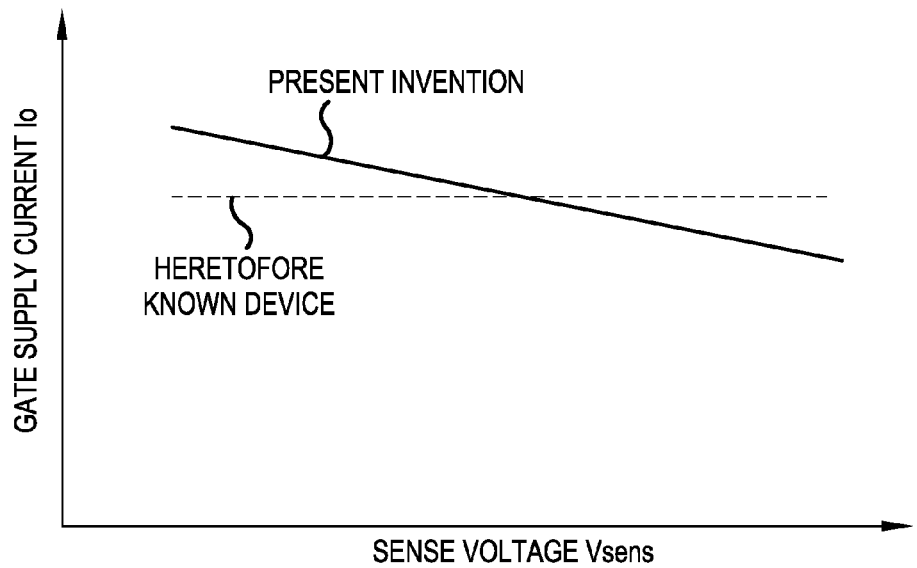
FIG. 2 is a diagram showing output current control characteristics of a constant current circuit in a drive circuit shown in FIG. 1.

As a result of this, even when there are variations in the gate threshold voltages of the plurality of IGBTs 2a to 2n connected in parallel, the size of the constant current supplied to the gates of the IGBTs 2a to 2n can be feedback controlled and optimized in accordance with the sense voltage Vsens, as shown in, for example, FIG. 2. Consequently, currents Ic flowing through the IGBTs 2a to 2n can be kept constant.

Figure 5:
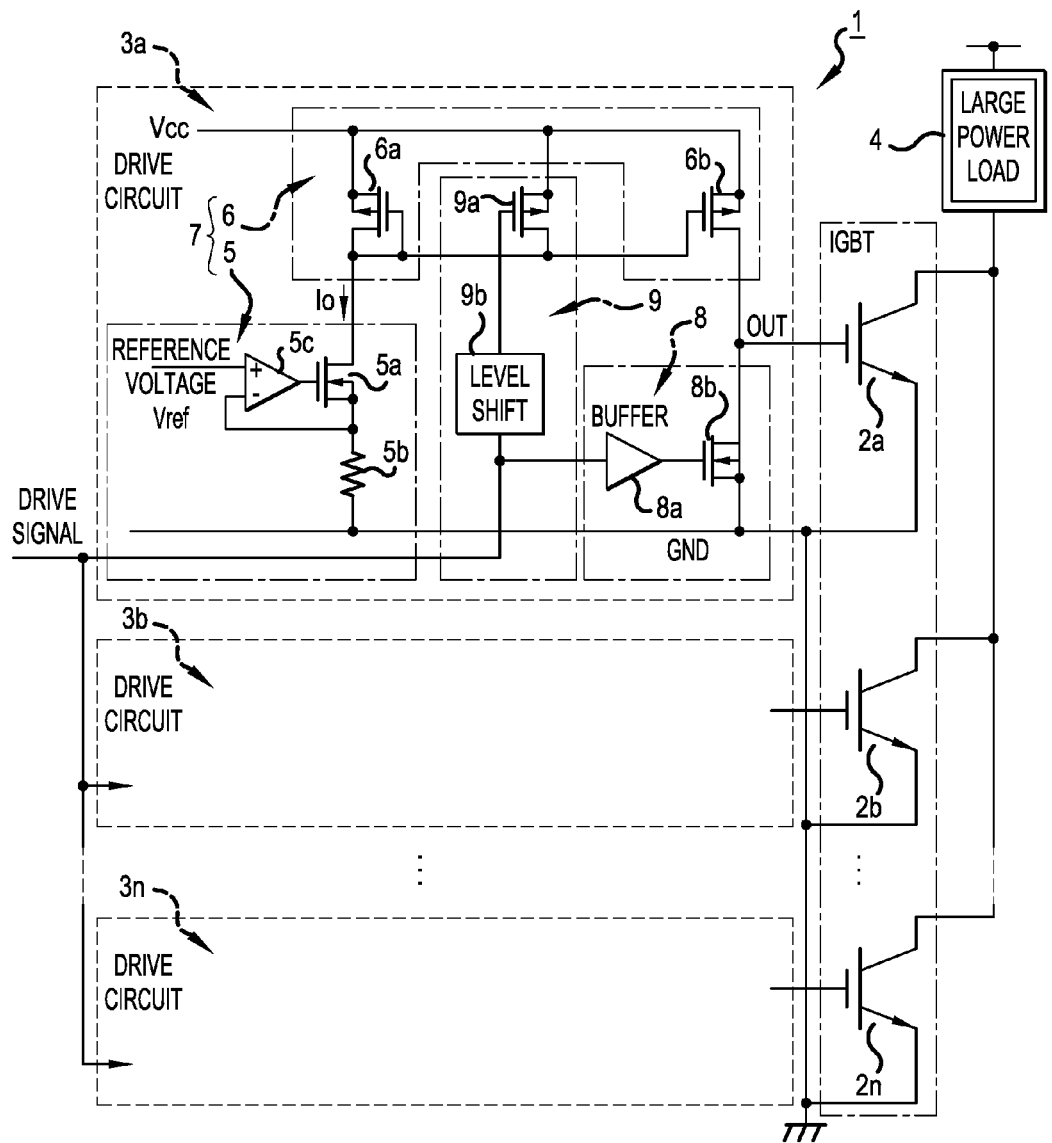
FIG. 5 is an outline configuration diagram of a heretofore known insulated gate semiconductor element drive device.

In a drive circuit of the configuration shown in FIG. 5, even when the currents flowing through the IGBTs 2a to 2n vary due to variations in the gate threshold voltages of the IGBTs 2a to 2n, that is, even when the sense voltage Vsens varies, a current supplied to the gate of each IGBT 2a to 2n is kept constant, as shown by the broken line in FIG. 2. Then, a current imbalance due to the variations in the gate threshold voltages are gradually increased, and the current concentrates on a certain IGBT, thus bringing about the possibility of causing a thermal breakdown of the IGBT, as previously described.

In this respect, according to the device of the configuration shown in FIG. 1, the size of the constant current supplied to the gates of the IGBTs 2a to 2n can be matched to the turn-on characteristics of the IGBTs 2a to 2n in accordance with the characteristics shown in FIG. 2. Further, the current Ic flowing through each IGBT 2a to 2n can be kept constant, as previously described. As a result of this, it is possible to effectively prevent the currents flowing one through each of the plurality of IGBTs 2a to 2n provided in parallel from being imbalanced, and it is possible to prevent a current concentration on a specific IGBT and prevent a thermal breakdown of the IGBT from occurring.

Figure 3:
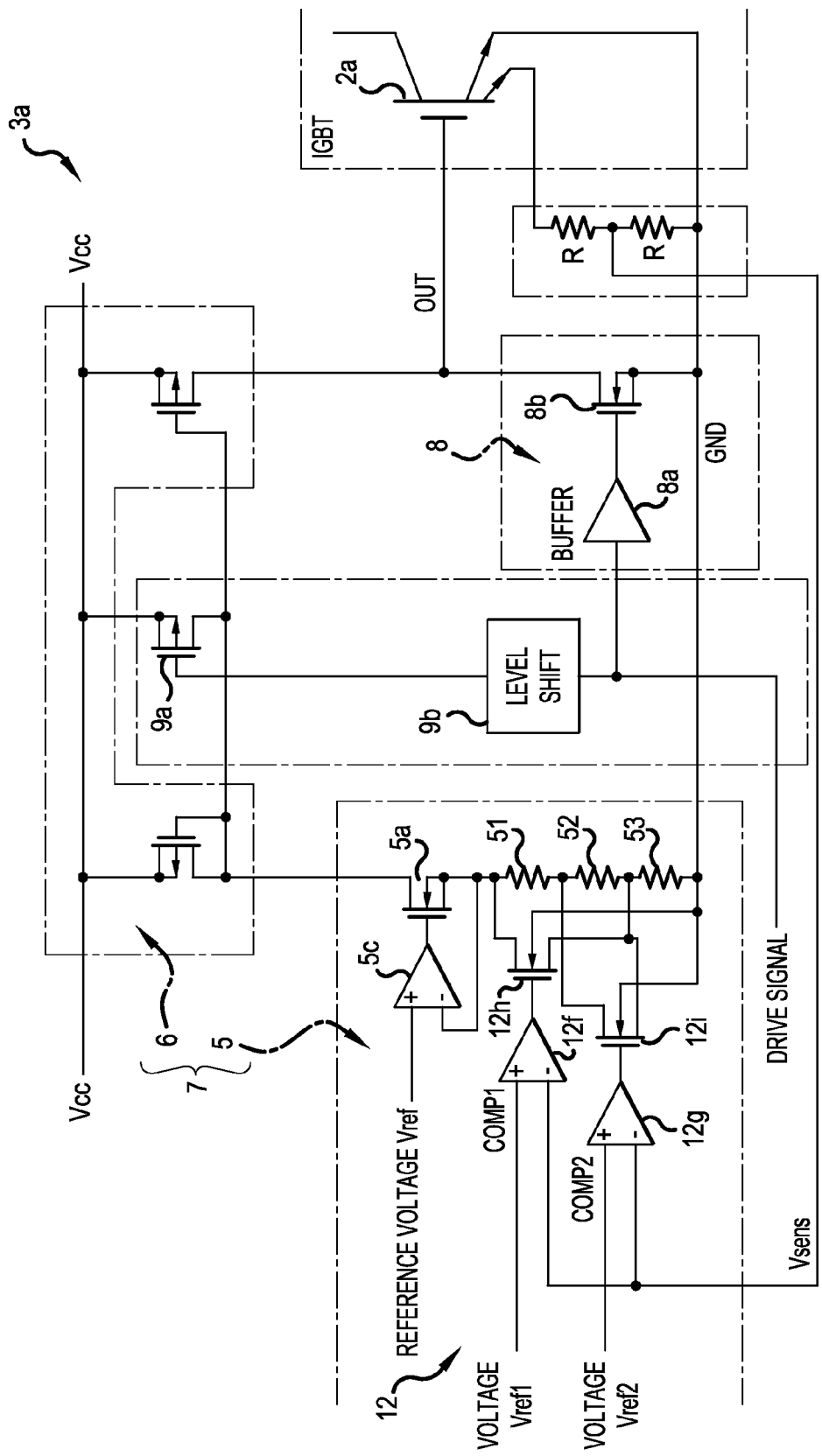
FIG. 3 is a main portion outline configuration diagram of an insulated gate semiconductor element drive device according to a second embodiment of the invention.

Now, FIG. 3 is a main portion outline configuration diagram of an insulated gate semiconductor element drive device according to a second embodiment of the invention. A drive circuit 3a according to the second embodiment compares the sense voltage Vsens with a first threshold voltage Vref1 and a second threshold voltage Vref2 (>Vref1) using two respective comparators 12f and 12g in place of the previously described OP amplifier 12a. Further, the drive circuit 3a is characterized in that it is configured so that a value Rref of grounding resistors connected to the source of the n-FET 5a is variably set in accordance with results of the comparisons.

Specifically, in place of the grounding resistor 5b in FIG. 1, three resistors 51, 52, and 53 connected in series are provided between the source of the n-FET 5a and the ground line. Further, a configuration is such that the resistors 51, 52, and 53 are selectively short-circuited using two n-FETs 12h and 12i which are on/off controlled by outputs of the comparators 12f and 12g. Further, the OP amplifier 5c compares a voltage generated in a series resistor circuit formed of the resistors 51, 52, and 53 which are selectively short-circuit controlled, as heretofore described, and the reference voltage Vref and controls a current flowing through the n-FET 5a so as to make the current constant.

Incidentally, when the sense voltage Vsens is lower than the first threshold voltage Vref1 [Vsens<Vref1], the comparator 12f assumes the role of turning on the n-FET 12h and short-circuiting the resistors 51 and 52. Also, when the sense voltage Vsens is lower than the second threshold voltage Vref2 [Vsens<Vref2], the comparator 12g assumes the role of turning on the n-FET 12i and short-circuiting the resistor 52.

Consequently, according to the current regulation circuit 12 configured in this way, when the sense voltage Vsens exceeds the second threshold voltage Vref2 [Vsens≥Vref2>Vref1], the outputs of the comparators 12f and 12g are both at the L level, and the n-FETs 12h and 12i are both kept in an off state. As a result of this, as it does not happen that the resistors 51, 52, and 53 are short-circuited, an output current IoH of the constant current source 5 (n-FET 5a) is:

$$IoH = Vref/(Rref1 + Rref2 + Rref3)$$

The Rref1, Rref2, and Rref3 represent the values of the resistors 51, 52, and 53 respectively.

Also, when the sense voltage Vsens is lower than the second threshold voltage Vref2 and exceeds the first threshold voltage Vref1 [Vref2≥Vsens≥Vref1], the output of the comparator 12f is kept at the L level, and the output of the comparator 12g is inverted to the H level. Then, the n-FET 12i is turned on, and the resistor 52 is short-circuited. As a result of this, an output current IoM of the constant current source 5 (n-FET 5a) is:

$$IoM = Vref/(Rref1 + Rref3)$$

Further, when the sense voltage Vsens further drops and becomes lower than the first threshold voltage Vref1 [Vref2>Vref1>Vsens], the outputs of the comparators 12f and 12g are both at the H level, and the n-FETs 12h and 12i are both turned on. As a result of this, as the resistors 51 and 52 are each short-circuited, an output current IoL of the constant current source 5 (n-FET 5a) is:

$$IoL = Vref/(Rref3)$$

Figure 4:
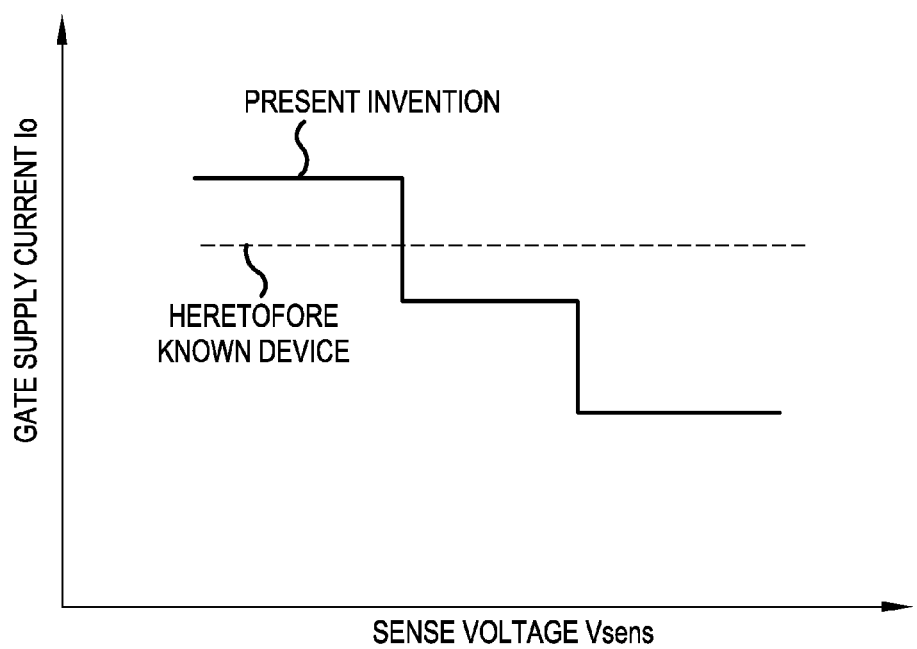
FIG. 4 is a diagram showing output current control characteristics of a constant current circuit in a drive circuit shown in FIG. 3.

Hence, according to the drive circuit 3 configured including this kind of current regulation circuit 12, it is possible to cause the output current of the constant current circuit 7 to vary in stages (three stages) in accordance with the sense voltage Vsens, as shown in FIG. 4. Consequently, although the control precision of the drive circuit 3 is rough compared with in the previously described embodiment, the size of the constant current supplied to each of the gates of the IGBTs 2a to 2n can be matched to the turn-on characteristics of the IGBTs 2a to 2n in the same way as in the previous embodiment. Further, the current Ic flowing through each IGBT 2a to 2n can be kept constant. As a result of this, it is possible to effectively prevent the currents flowing one through each of the plurality of IGBTs 2a to 2n provided in parallel from being imbalanced. Therefore, it is possible to prevent a current concentration on a specific IGBT and prevent a thermal breakdown of the IGBT from occurring.

The invention is not limited to each heretofore described embodiment. For example, a variable setting in still more stages in accordance with the output current Io of the constant current source 5 and with the sense voltage Vsens is also naturally possible. Also, it is also possible to detect currents flowing through the IGBTs 2a to 2n from a voltage generated in a shunt resistor connected to the emitter of each IGBT 2a to 2n. Furthermore, it goes without saying that the invention is also similarly applicable to the case of driving MOS-FETs in place of the previously described IGBTs. Apart from this, the invention can be implemented modified in various ways without departing from the scope thereof.

What is claimed is:

1. An insulated gate semiconductor element drive device, including a plurality of drive circuits which drive a plurality of respective insulated gate semiconductor elements connected in parallel, which drives each of the drive circuits in accordance with a control signal and drives the plurality of insulated gate semiconductor elements in parallel, each of the drives circuits comprising:

a constant current circuit which supplies a constant current to the gate of the insulated gate semiconductor element and on-operates the insulated gate semiconductor element;

a discharge circuit which grounds the gate of the insulated gate semiconductor element and off-operates the insulated gate semiconductor element;

a switch circuit which operates one of the constant current circuit or discharge circuit in accordance with a control signal and turns on or off the insulated gate semiconductor element;

a current detection circuit which detects a current flowing through the insulated gate semiconductor element when the insulated gate semiconductor element is turned on; and a current regulation circuit which feeds the current detected by the current detection circuit back to the constant current circuit and controls an output current of the constant current circuit.

2. The insulated gate semiconductor element drive device according to claim 1, wherein the insulated gate semiconductor element is an IGBT or a MOS-FET.

3. The insulated gate semiconductor element drive device according to claim 1, wherein the current regulation circuit is formed of an error amplifier which obtains a voltage difference between a preset reference voltage and an output voltage of the current detection circuit and determines the output current of the constant current circuit in accordance with the voltage difference.

4. The insulated gate semiconductor element drive device according to claim 1, wherein the current regulation circuit is formed of a comparator which compares a preset reference voltage and an output voltage of the current detection circuit and causes the output current of the constant current circuit to vary in multiple stages in accordance with a result of the comparison.

5. The insulated gate semiconductor element drive device according to claim 1, wherein the constant current circuit is formed of a current mirror circuit, interposed between the gate of the insulated gate semiconductor element and a power supply voltage, and a constant current source which supplies a current to the insulated gate semiconductor element via the current mirror circuit.

* * * * *